US007677195B2

(12) United States Patent
Lee et al.

(10) Patent No.: US 7,677,195 B2
(45) Date of Patent: Mar. 16, 2010

(54) APPARATUS FOR SUPPLYING A DROPLET ON A SUBSTRATE AND METHOD OF MANUFACTURING DISPLAY APPARATUS USING THE SAME

(75) Inventors: Dong-Won Lee, Seongnam-si (KR); Joon-Hoo Choi, Seoul (KR); Jin-Koo Chung, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 467 days.

(21) Appl. No.: 10/894,088

(22) Filed: Jul. 19, 2004

(65) Prior Publication Data
US 2005/0110852 A1    May 26, 2005

(30) Foreign Application Priority Data
Nov. 21, 2003    (KR) .................... 10-2003-0083105

(51) Int. Cl.
 B05B 3/00    (2006.01)
 B05B 7/06    (2006.01)
 B05B 13/02    (2006.01)
 B05C 11/06    (2006.01)
(52) U.S. Cl. .................. 118/323; 118/313; 118/315; 118/305; 118/62; 347/97
(58) Field of Classification Search ............... 118/300, 118/302, 305, 46, 313, 314–315, 321, 323; 347/97, 34, 782, 95, 25, 28
See application file for complete search history.

(56) References Cited

U.S. PATENT DOCUMENTS 4,223,324 A * 9/1980 Yamamori et al. ............ 347/21
4,662,398 A * 5/1987 Wywailowski et al. ... 137/625.4
5,516,273 A * 5/1996 Delmore et al. ......... 425/192 R
6,660,332 B2 * 12/2003 Kawase et al. .............. 427/266
6,793,324 B2 * 9/2004 Hosono et al. ................ 347/54
2003/0159651 A1    8/2003 Sakurada
2003/0235935 A1 * 12/2003 Yamazaki et al. ............. 438/89
2004/0001921 A1 * 1/2004 Kolb et al. .................. 427/421

(Continued)

FOREIGN PATENT DOCUMENTS

CN    1439517    9/2003

OTHER PUBLICATIONS

Chinese Office Action dated Nov. 9, 2007 issued in corresponding Korean Patent Appln. No. 2003-83105.

*Primary Examiner*—Yewebdar T Tadesse
(74) *Attorney, Agent, or Firm*—F. Chau & Associates, LLC

(57) ABSTRACT

In an apparatus for supplying a droplet on a substrate and a method of manufacturing a display apparatus, the apparatus includes a base body, a dropping unit and a vapor supplying unit. The base body corresponds to the substrate disposed on a stage. The dropping unit is disposed on the base body. The dropping unit includes a nozzle to drop the droplet on the substrate. The vapor supplying unit is disposed adjacent to the dropping unit to supply the droplet dropped onto the substrate with a volatile solvent vapor. Therefore, an evaporation rate of the droplet dropped onto pixels is adjusted to uniformize a thickness of the layer, thereby improving the image display quality.

5 Claims, 19 Drawing Sheets

U.S. PATENT DOCUMENTS

| | | | |
|---|---|---|---|
| 2004/0008243 A1* | 1/2004 | Sekiya | 347/95 |
| 2004/0062875 A1* | 4/2004 | Chappa et al. | 427/421 |
| 2004/0246282 A1* | 12/2004 | Usui | 347/6 |

* cited by examiner

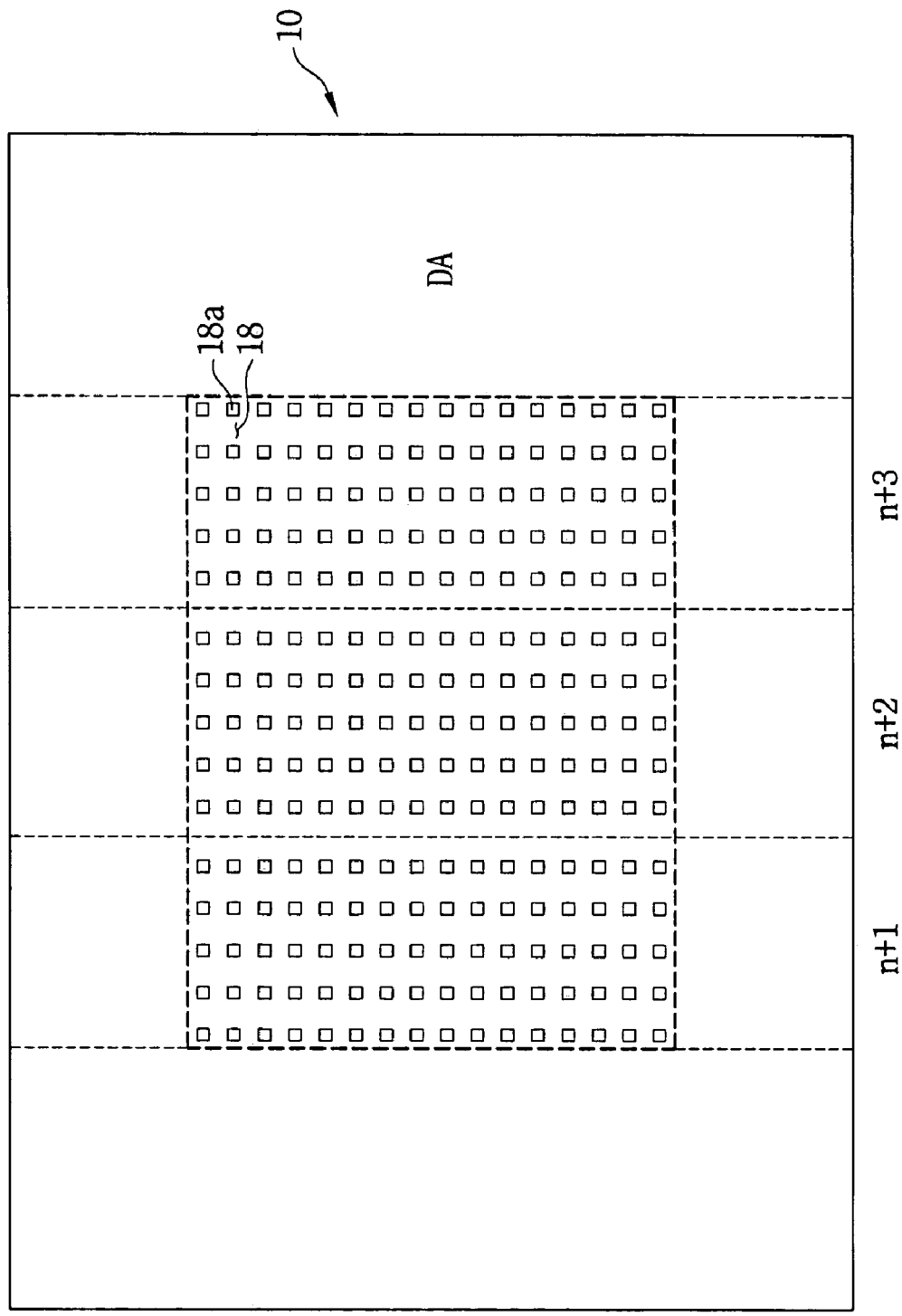

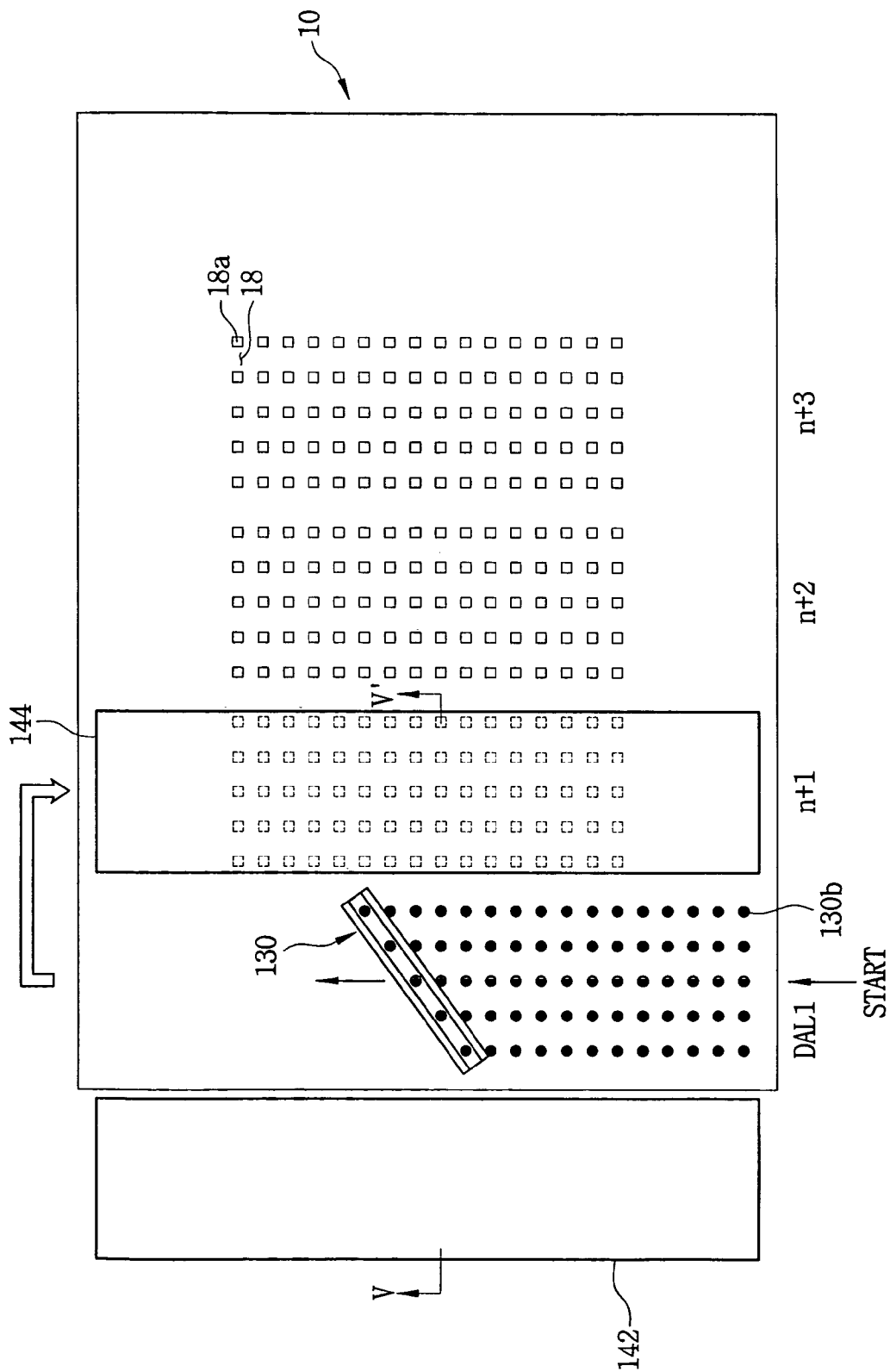

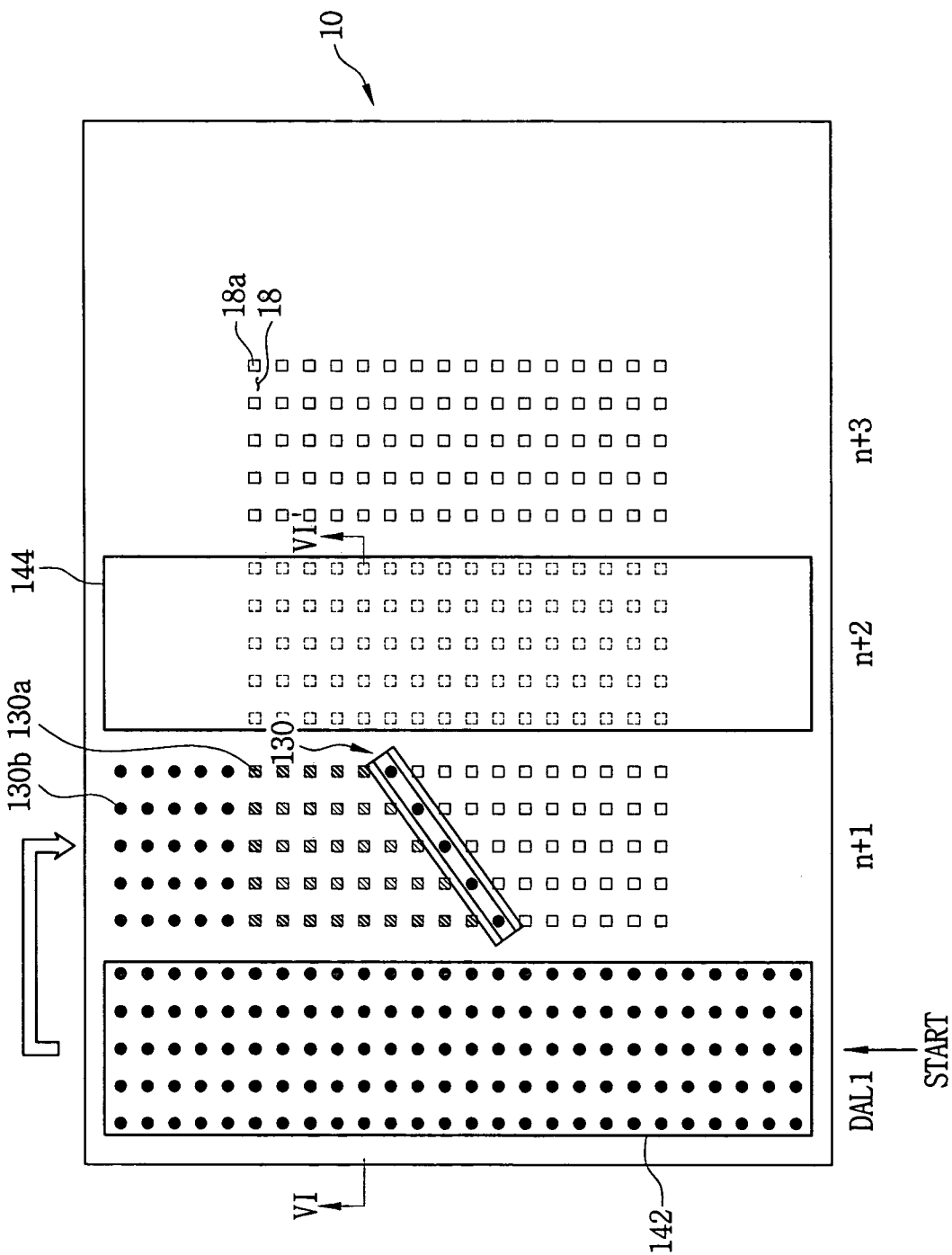

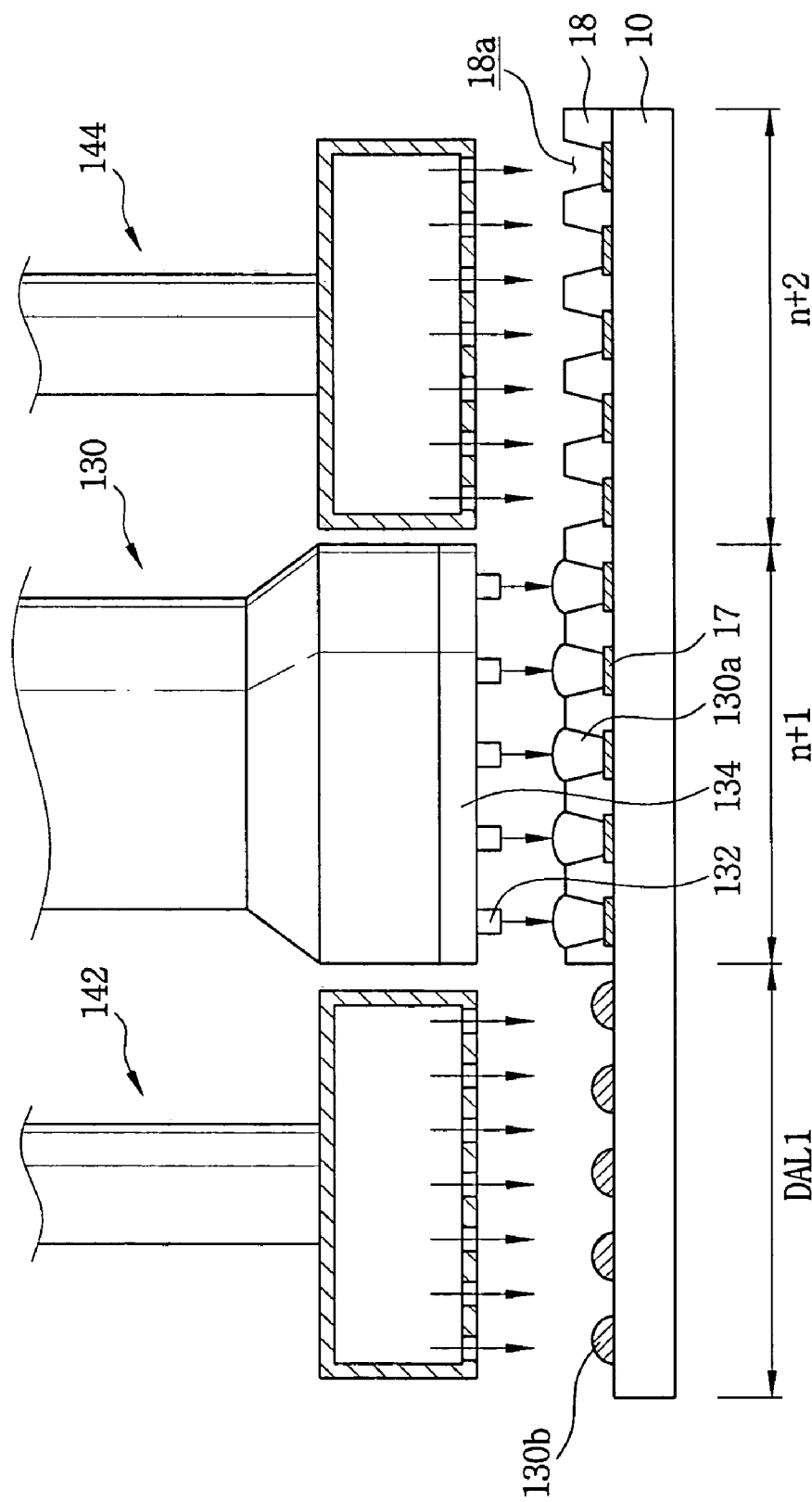

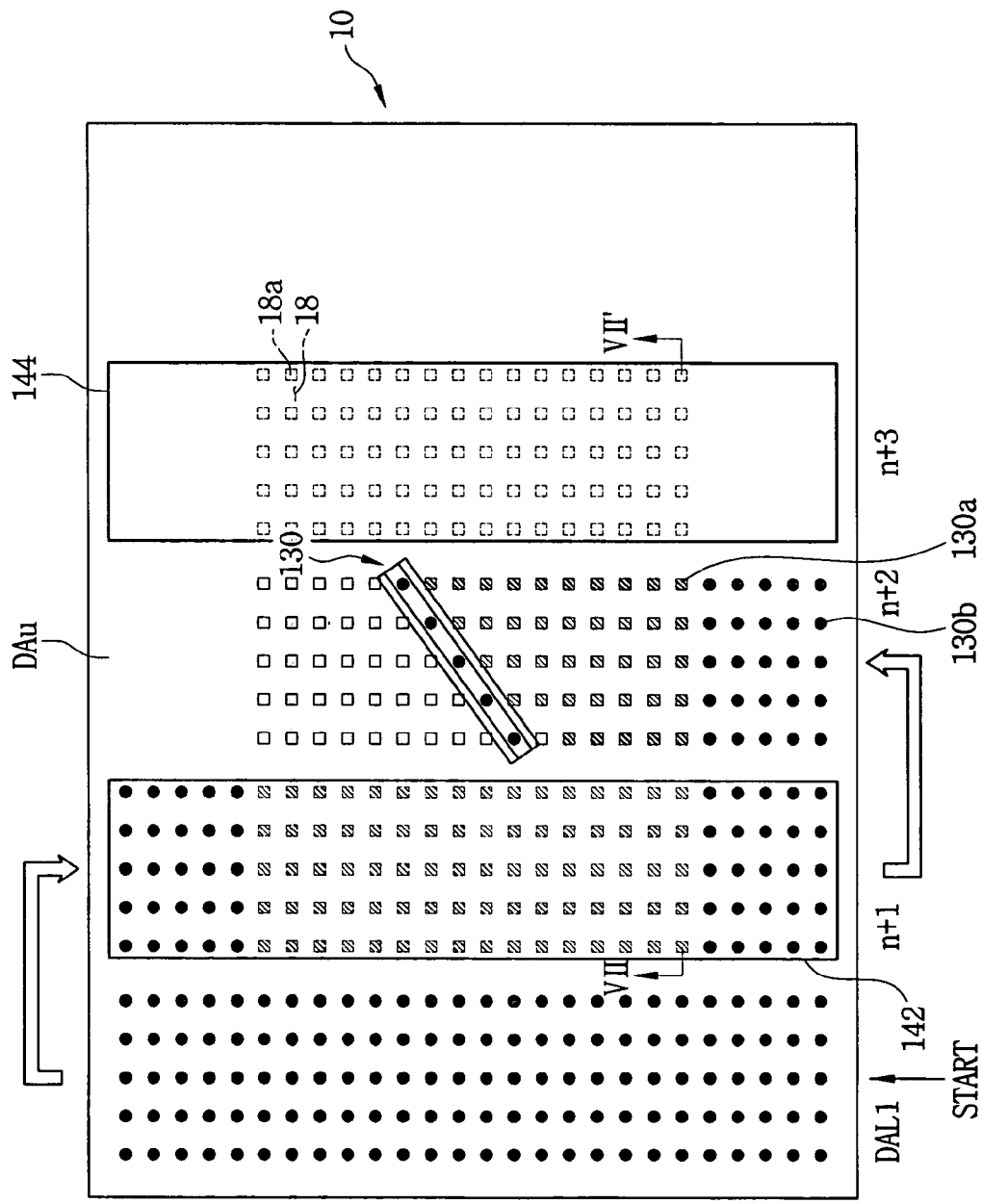

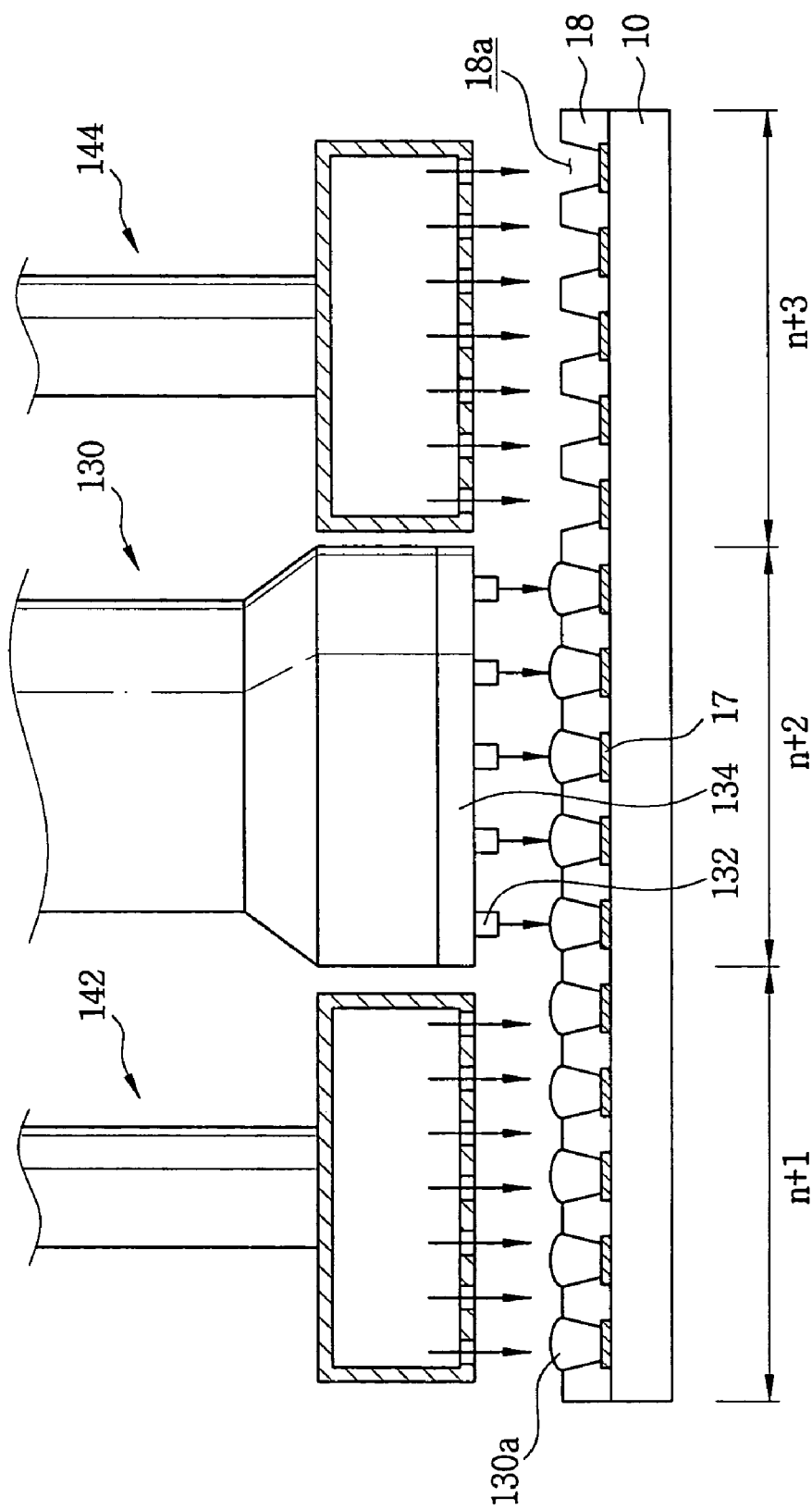

3 # APPARATUS FOR SUPPLYING A DROPLET ON A SUBSTRATE AND METHOD OF MANUFACTURING DISPLAY APPARATUS USING THE SAME

CROSS-REFERENCE OF RELATED APPLICATIONS

The present application claims priority from Korean Patent Application No. 2003-83105, filed on Nov. 21, 2003, the disclosure of which is hereby incorporated herein by reference in its entirety.

BACKGROUND OF THE INVENTION

1. Field of the Invention

The present invention relates to an apparatus for supplying a droplet on a substrate and a method of manufacturing a display apparatus using the apparatus for supplying the droplet on the substrate. More particularly, the present invention relates to an apparatus for supplying a droplet on a substrate capable of uniformizing an evaporation rate of the droplet having a volatile solvent, and a method of manufacturing a display apparatus using the apparatus for supplying the droplet on the substrate.

2. Description of the Related Art

A capacity of an information processing apparatus has been increased, and the information processing apparatus is widely used.

The information processing apparatus outputs data that is coded as an electric signal. The information processing apparatus includes a display apparatus so as to display an image corresponding to the electric signal.

The display apparatus may be classified into an emissive display apparatus and a non-emissive display apparatus.

The emissive display apparatus displays an image using a light emitting element. Examples of the emissive display apparatus are a cathode ray tube (CRT), a plasma display panel (PDP), a light emitting diode (LED), an organic light emitting display apparatus (OLED), etc.

The non-emissive display apparatus displays an image using a light reflection, a light diffusion, a light interference, etc. Examples of the non-emissive display apparatus are a liquid crystal display (LCD) apparatus, an electrochemical display (ECD) apparatus, an electrophoretic image display (EPID) apparatus, etc.

The OLED apparatus has various characteristics, for example, such as high luminance, light weight, thin thickness, low power consumption, etc.

When a high voltage is applied to a light emitting region, molecules in the light emitting region are excited, and the excited molecules are then dropped to a ground state to generate a light.

The OLED apparatus may also include an organic light emitting layer disposed between a pixel electrode and a counter electrode. The pixel electrode supplies the organic light emitting layer with electrons, and the counter electrode supplies the organic light emitting layer with holes so that the electrons are combined with the holes. Therefore, the molecules in the organic light emitting layer are excited. When the excited molecules are dropped to the ground state, a light is generated.

The organic light emitting layer of the OLED may be formed using a screen printing process, a nozzle printing process, etc.

In the screen printing process, a material that forms an organic light emitting layer is supplied to a substrate through openings of a mask.

In the nozzle printing process, a material that forms an organic light emitting layer, which has a volatile solvent, is dropped onto a substrate through a nozzle. In order to form the organic light emitting layer, a partition wall that surrounds the pixel electrode is formed. The material that forms the organic light emitting layer is dropped in a cavity formed by the partition wall. The dropped material that forms the organic light emitting layer is then dried to form the organic light emitting layer.

When the number of the pixel electrodes is increased, the material that forms the organic light emitting layer may not be dropped simultaneously. Therefore, the substrate may be divided into several groups and the material that forms the organic light emitting layer may be printed corresponding to each of the groups.

The evaporation rate of the material that forms the organic light emitting layer that is disposed on the peripheral portion of each of the groups may be different from the evaporation rate of the material that forms the organic light emitting layer that is disposed on the central portion of the group.

When the evaporation rates of the material disposed on the peripheral portion and the central portion, respectively, are different from each other, the thickness of the organic light emitting layer in the peripheral portion may be different from the thickness of the organic light emitting layer in the central portion so that the luminance corresponding to the peripheral portion may be different from the luminance corresponding to the central portion, thereby deteriorating the image display quality.

SUMMARY OF THE INVENTION

The present invention provides an apparatus for supplying a droplet on a substrate capable of uniformizing an evaporation rate of the droplet having a volatile solvent.

The present invention also provides a method of manufacturing a display apparatus using the above-mentioned apparatus for supplying the droplet on the substrate.

An apparatus for supplying a droplet on a substrate in accordance with an aspect of the present invention includes a base body, a dropping unit and a vapor supplying unit. The base body corresponds to the substrate disposed on a stage. The dropping unit is disposed on the base body. The dropping unit includes a nozzle to drop the droplet on the substrate. The vapor supplying unit is disposed adjacent to the dropping unit to supply the droplet dropped onto the substrate with a volatile solvent vapor.

An apparatus for supplying a droplet on a substrate in accordance with another aspect of the present invention includes a base body, a dropping unit, a vapor supplying unit and a base transporting unit. The base body corresponds to the substrate disposed on a stage. The dropping unit is disposed on the base body and transported in a first direction. The dropping unit includes a nozzle to drop the droplet having a coating material on the substrate. The coating material includes a solute and a volatile solvent. The vapor supplying unit is disposed on the base body adjacent to the dropping unit and shifted in a second direction to supply the droplet dropped onto the substrate with a volatile solvent vapor so as to uniformize an evaporation rate of the volatile solvent. The base transporting unit transports the base body in the second direction.

An apparatus for supplying a droplet on a substrate in accordance with still another aspect of the present invention includes a base body, a dropping unit and a chamber. The base body corresponds to the substrate disposed on a stage. The dropping unit is disposed on the base body and transported in a first direction. The dropping unit includes a nozzle to drop the droplet having a coating material on the substrate. The coating material includes a solute and a volatile solvent. The chamber includes a chamber body that has a receiving space to receive the base body and the dropping unit, and a vapor supplying unit that supplies the receiving space with volatile solvent vapor.

An apparatus for supplying a droplet on a substrate in accordance with still another aspect of the present invention includes a base body, a dropping unit and a vapor supplying unit. The base body corresponds to the substrate disposed on a stage. The dropping unit is disposed on the base body. The dropping unit includes a nozzle to drop the droplet on the substrate. The vapor supplying unit is disposed adjacent to the dropping unit to supply an upper surface of the substrate with a volatile solvent vapor.

A method of manufacturing a display apparatus in accordance with an exemplary embodiment of the present invention is provided. A first electrode applied with a driving signal is formed on a substrate. Partition walls are formed on the substrate. The partition walls surround the first electrode to form a cavity on the first electrode. A droplet having a volatile solvent and a material that forms an organic light emitting layer is dropped into the cavity, while volatile solvent vapor is supplied to the droplet. The droplet is dried to form an organic light emitting layer on the first electrode. A second electrode is formed on the organic light emitting layer.

The apparatus for supplying a droplet on a substrate may form an organic light emitting layer of an OLED apparatus, a hole injection layer of the OLED apparatus, an electron injection layer of the OLED apparatus, a bank of the OLED apparatus, a color filter of a liquid crystal display (LCD) apparatus, a fluorescent layer of a plasma display panel (PDP) apparatus, etc.

Therefore, an evaporation rate of a droplet dropped onto pixels is adjusted to uniformize a thickness of a layer, thereby improving the image display quality.

BRIEF DESCRIPTION OF THE DRAWINGS

The above and other advantages of the present invention will become more apparent by describing in detail exemplary embodiments thereof with reference to the accompanying drawings, in which:

FIG. 8 is a plan view showing partition walls according to another exemplary embodiment of the present invention;

FIGS. 9A, 9C and 9E are plan views showing a method of manufacturing a display apparatus using an apparatus for supplying a droplet on a substrate according to an exemplary embodiment of the present invention;

FIG. 9D is a cross-sectional view taken along the line VI-VI' in FIG. 9C;

FIG. 9F is a cross-sectional view taken along the line VII-VII' in FIG. 9E;

DESCRIPTION OF THE EMBODIMENTS

Hereinafter, the embodiments of the present invention will be described in detail with reference to the accompanying drawings.

Figure 1:
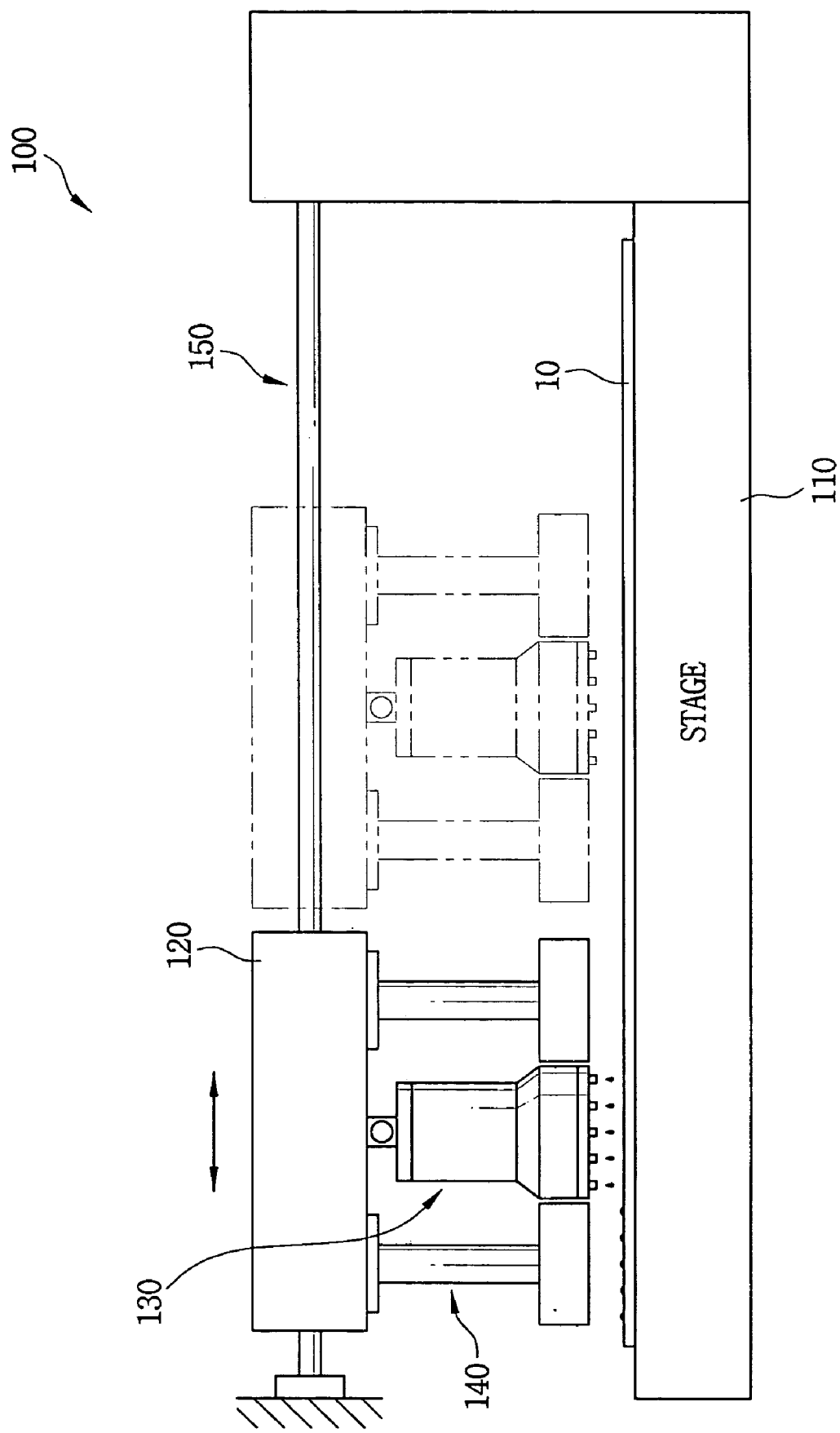
FIG. 1 is a cross-sectional view showing an apparatus for supplying a droplet on a substrate according to an exemplary embodiment of the present invention.

FIG. 1 is a cross-sectional view showing an apparatus 100 for supplying a droplet on a substrate 10 according to an exemplary embodiment of the present invention.

Referring to FIG. 1, the apparatus 100 for supplying the droplet on the substrate 10 includes a stage 110, a base body 120, a dropping unit 130, a vapor supplying unit 140 and a base transporting unit 150.

The substrate 10 is disposed on the stage 110. The substrate 10 may include an organic light emitting element having an organic light emitting layer.

The base body 120 is disposed on the stage 110. The dropping unit 130 and the vapor supplying unit 140 are secured with the base body 120.

Figure 2:
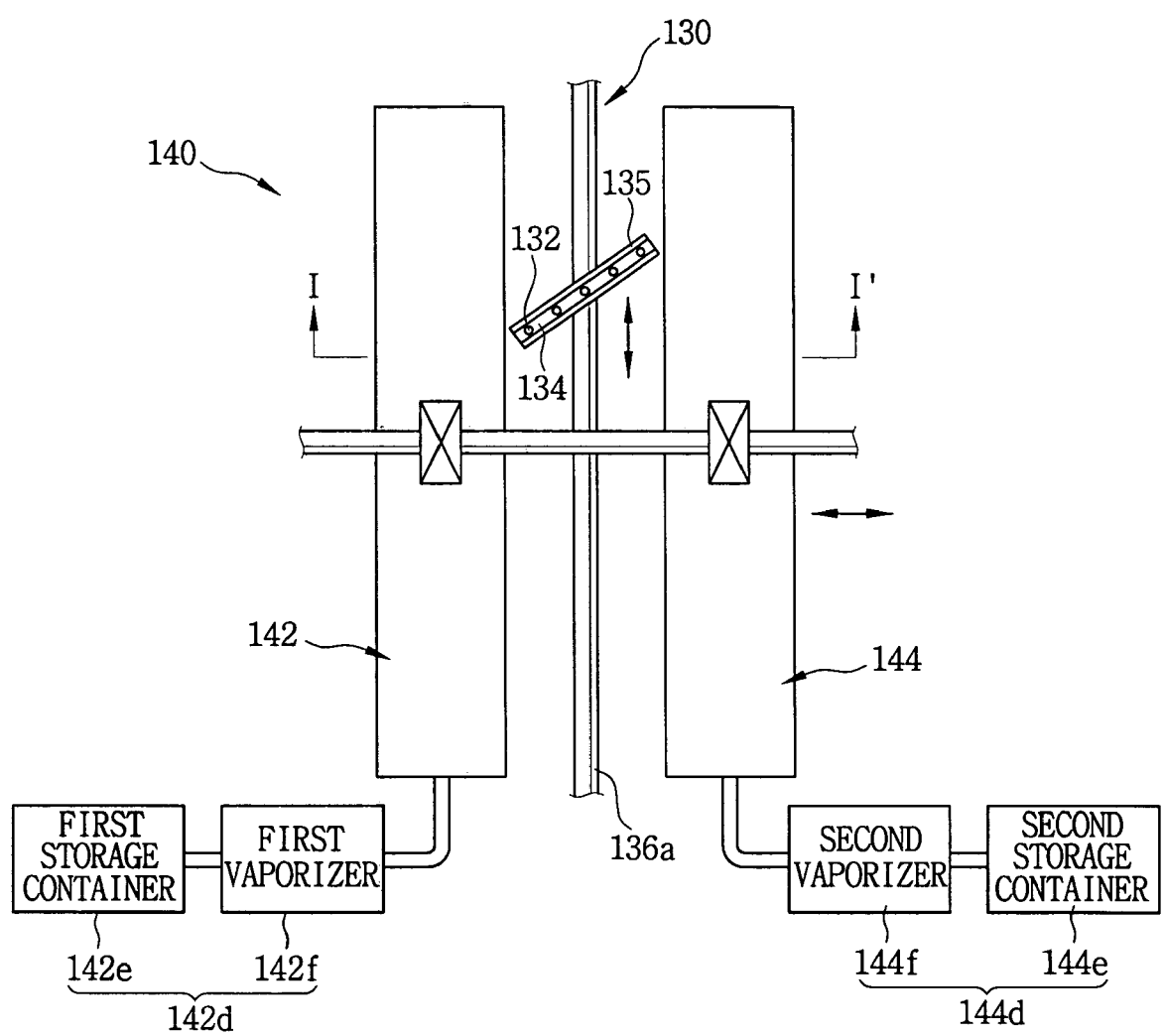
FIG. 2 is a plan view showing a dropping unit and a vapor supplying unit according to an exemplary embodiment of the present invention.
Figure 3:
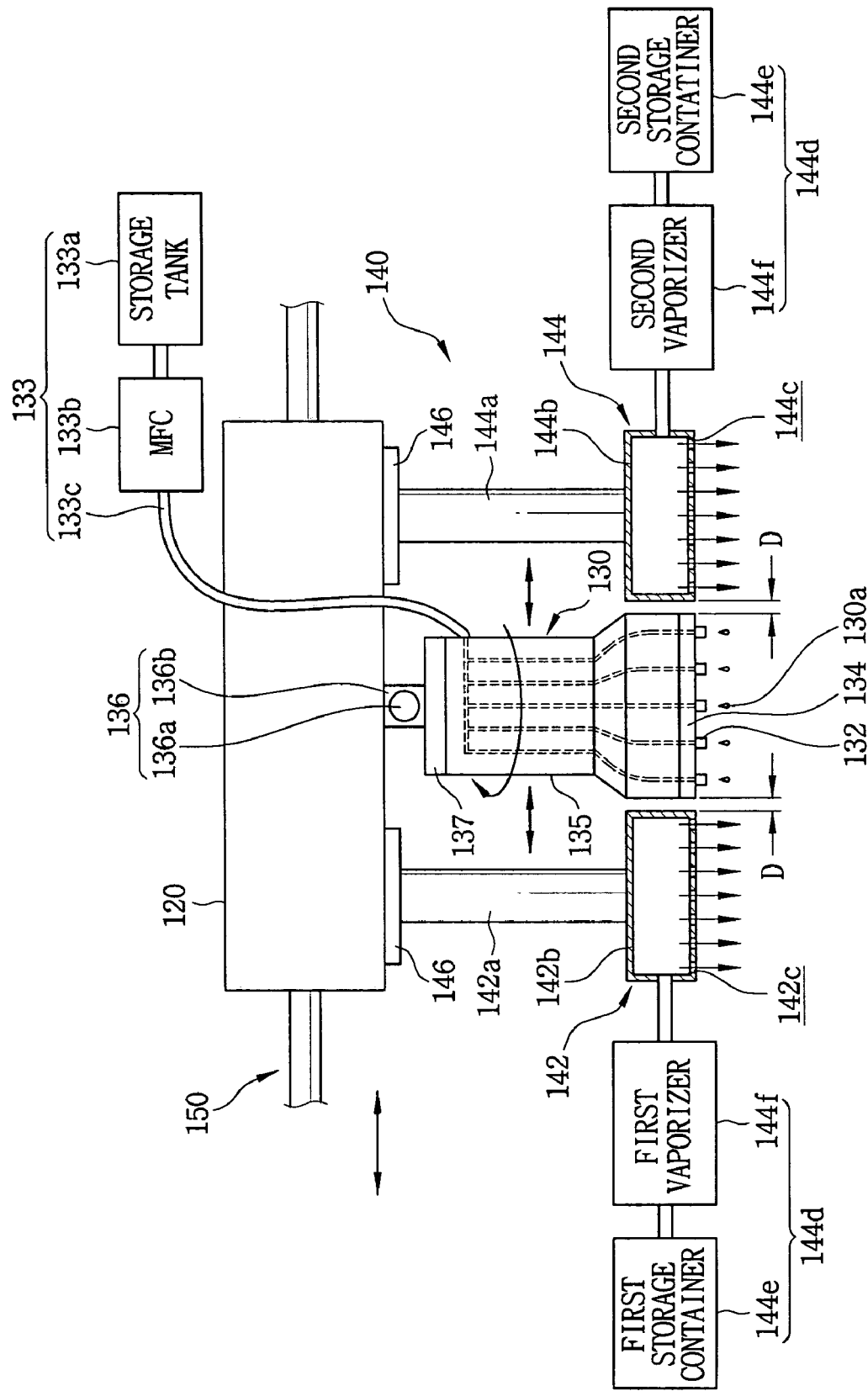
FIG. 3 is a cross-sectional view taken along the line I-I' in FIG. 2.

FIG. 2 is a plan view showing a dropping unit and a vapor supplying unit according to an exemplary embodiment of the present invention. FIG. 3 is a cross-sectional view taken along the line I-I' in FIG. 2.

Referring to FIGS. 1 to 3, the dropping unit 130 is secured with the base body 120. The dropping unit 130 includes a nozzle through which a coating material including a solute and a volatile solvent is dropped onto the substrate 10. The dropping unit 130 may include a plurality of nozzles 132. The solute may include various materials, for example, such as a material that forms a hole injection layer, a material that that forms an electron injection layer, a material that forms an organic light emitting layer, a material that forms a color filter, an organic material having photoresist, etc. The dropping unit 130 may be transported in a first direction, and may be shifted in a second direction. The second direction is different from the first direction. For example, the second direction may be substantially perpendicular to the first direction. The solute may include the material that forms the organic light emitting layer.

The dropping unit 130 includes a coating material supplying module 133, a nozzle plate 134, a housing 135 and a housing transporting module 136.

The coating material supplying module 133 supplies the substrate 10 disposed on the stage 110 with a coating material through the nozzles 132. The coating material supplying module 133 includes a storage tank 133a storing the coating material, a pipe 133c guiding the coating material from the storage tank 133a into the nozzles 132, and a mass flow controller (MFC) 133b controlling a flow amount of the coating material. The coating material stored in the storage tank 133a includes the solute and the volatile solvent. The storage tank 133a intermittently supplies the nozzles 132 with the coating material through the pipe 133c using the MFC 133b.

The nozzle plate 134 is secured with the nozzles 132. The nozzles 132 are connected to the pipe 133c, through which the coating material is supplied to the nozzles 132. Each of the nozzles 132 transforms the coating material into the droplet 130a having a small size, and the droplet 130a is dropped onto the substrate 10 disposed on the stage 110. That is, a plurality of droplets 130a may be dropped onto the substrate 10.

The nozzles 132 are secured with the housing 135 that is secured with the housing transporting module 136.

The housing transporting module 136 is disposed on the base body 120 to transport the housing 135 of the dropping unit 130 in the first direction. The housing transporting module 136 includes a first transporting rod 136a extended in the first direction, and a first transporting portion 136b transporting the housing 135 along the first transporting rod 136a.

Both end portions of the first transporting rod 136a are pivoted to the base body 120, and the first transporting rod 136a is screwed onto the housing 135. The first transporting portion 136b rotates the first transporting rod 136a in clockwise/counterclockwise direction so that the housing 135 may be transported along the first transporting rod 136a that is extended in the first direction.

Alternatively, the first transporting rod 136a may be secured with the base body 120, and the first transporting rod 136a may slide on the housing 135 so that the first transporting portion 136b transports the housing 135 in the first direction using a cylinder. The first transporting portion 136b may transports the housing 135 on the stage 110. Therefore, the housing 135 may be transported along the first transporting rod 136a that is extended in the first direction.

The dropping unit 130 may further include a rotating unit 137 that rotates the nozzles 132, whereas the nozzles 132 are arranged in substantially parallel with the substrate 10. The rotation axis of the rotating unit 137 is substantially perpendicular to a surface of the substrate 10. The rotating unit 137 controls a distance between the nozzles 132, and a distance between the droplets 130a dropped onto the substrate 10 may be less than the distance between the nozzles 132.

The vapor supplying unit 140 uniformizes the evaporation rate of the volatile solvent in the droplets 130a that are dropped onto the substrate 10, thereby uniformizing a thickness of the coated layer formed by the droplets 130a.

The vapor supplying unit 140 is disposed on the base body 120. The vapor supplying unit 140 includes a first supplying module 142 and a second supplying module 144. Alternatively, one of the first supplying module 142 and the second supplying module 144 may be omitted.

The first supplying module 142 is disposed on the base body 120 using a first supporting member 142a. The first supplying module 142 has a rectangular parallelepiped shape, and a major axis of the first supplying module 142 is in substantially parallel with the first direction. The first supplying module 142 includes a first body 142b, a first nozzle hole 142c and a first solvent vapor supplying portion 142d. Alternatively, the first supplying module 142 may include a plurality of first nozzle holes 142c.

The first body 142b has a rectangular parallelepiped shape having a cavity in the first body 142b. The first nozzle holes 142c are disposed on a surface of the first body 142b corresponding to the stage 110. The first solvent vapor supplying portion 142d supplies the first body 142b with a solvent vapor. The solvent vapor supplied from the first solvent vapor supplying portion 142d is substantially identical to the volatile solvent in the coating material. The first solvent vapor supplying portion 142d includes a first storage container 142e storing the volatile solvent and a first vaporizer 142f vaporizing the volatile solvent.

The second supplying module 144 is disposed on the base body 120 using a second supporting member 144a. The second supplying module 144 has a rectangular parallelepiped shape, and a major axis of the second supplying module 144 is in substantially parallel with the first direction. The second supplying module 144 includes a second body 144b, a second nozzle hole 144c and a second solvent vapor supplying portion 144d. The second supplying module 144 may include a plurality of second nozzle holes 144c.

The second body 144b has a rectangular parallelepiped shape having a cavity in the second body 144b. The second nozzle holes 142c are disposed on a surface of the second body 144b corresponding to the stage 110. The second solvent vapor supplying portion 144d supplies the second body 144b with a solvent vapor. The solvent vapor supplied from the second solvent vapor supplying portion 144d is substantially identical to the volatile solvent in the coating material. The second solvent vapor supplying portion 144d includes a second storage container 144e storing the volatile solvent and a second vaporizer 144f vaporizing the volatile solvent.

Alternatively, one solvent vapor supplying unit may supply the first and second supplying modules 142 and 144 with the volatile solvent vapor.

Preferably, a size of the volatile solvent vapor ejected through the first and second nozzle holes 142c and 144c is no more than about 5 μm. When the size of the volatile solvent vapor is larger than about 5 μm, the volatile solvent vapor may be directly dropped onto the substrate 10 so that the surface of the substrate 10 may be polluted and the thickness of the coating material may be different from one another.

The droplets 130a are dropped onto the substrate 10 while the volatile solvent vapor is supplied onto the substrate 10. Therefore, the evaporation rate of the droplets 130a is uniformized so that the coated layer having uniform thickness is formed on the substrate 10.

The vapor supplying unit 140 may further include a distance control module 146. When the nozzles 132 of the dropping unit 130 are rotated by the rotating unit 137, a distance D between the nozzles 132 and the vapor supplying unit 140 is changed. The distance control module 146 controls the distance D.

The base transporting unit 150 transports the dropping unit 130 and the vapor supplying unit 140 in the second direction. The base transporting unit 150 is disposed on the base body 120. The base transporting unit 150 may be operated using a screw method, a cylinder method, etc.

Figure 4:
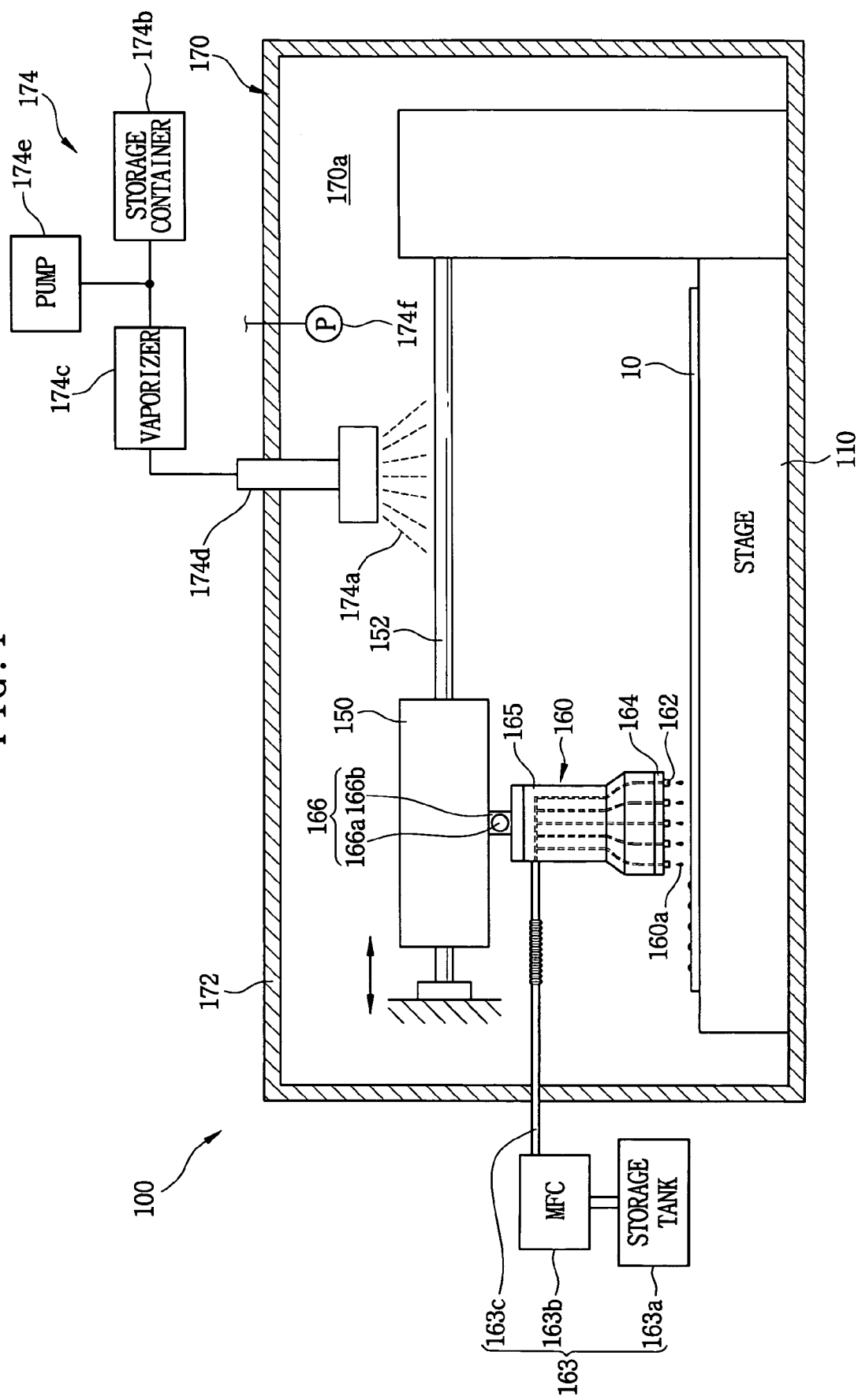
FIG. 4 is a cross-sectional view showing an apparatus for supplying a droplet on a substrate according to another exemplary embodiment of the present invention.

FIG. 4 is a cross-sectional view showing an apparatus for supplying a droplet on a substrate according to another exemplary embodiment of the present invention. With reference to FIG. 4, the same reference numerals denote the same elements in FIGS. 1 to 3, and thus any further detailed descriptions concerning the same elements will be omitted.

Referring to FIG. 4, the apparatus for supplying the droplet on the substrate 100 includes a base body 150, a dropping unit 160 and a chamber 170.

The base body 150 is disposed at a position corresponding to a stage 110 having the substrate 10 disposed on the stage 110. The base body 150 is transported along a transporting rod 152 that is extended in a first direction.

The dropping unit 160 supplies the substrate 10 disposed on the stage 110 with the droplet having a coating material. The dropping unit 160 may supply the substrate 10 with a plurality of droplets 160a. The dropping unit 160 is secured with the base body 150.

The dropping unit 160 includes a nozzle through which a coating material including a solute and a volatile solvent is dropped onto the substrate 10. The dropping unit 160 may include a plurality of nozzles 162. The dropping unit 160 may be transported in the first direction, and may be shifted in a second direction that is substantially perpendicular to the first direction. The solute includes a material that forms an organic light emitting layer. The solute may include a material that forms a hole injection layer, a material that that forms an electron injection layer or a material that forms an organic light emitting layer.

The dropping unit 160 includes a coating material supplying module 163, a nozzle plate 164, a housing 165 and a housing transporting module 166.

The coating material supplying module 163 supplies the substrate 10 disposed on the stage 110 with a coating material through the nozzles 162. The coating material supplying module 163 includes a storage tank 163a storing the coating material, a pipe 163c guiding the coating material from the storage tank 163a into the nozzles 162, and a mass flow controller (MFC) 163b controlling a flow amount of the coating material. The coating material stored in the storage tank 163a includes the solute and the volatile solvent. The storage tank 163a intermittently supplies the nozzles 162 with the coating material through the pipe 163c using the MFC 163b.

The nozzle plate 164 is secured with the nozzles 162. The nozzles 162 are connected to the pipe 163c so that the coating material is supplied to the substrate 10 through the nozzles 162. Each of the nozzles 162 transforms the coating material into the droplet 160a having a small size, and the droplet 160a is dropped onto the substrate 10 disposed on the stage 110.

The nozzles 162 are secured with the housing 165.

The housing transporting module 166 is disposed on the base body 150 to transport the housing 165 of the dropping unit 160 in the first direction. The housing transporting module 166 includes a first transporting rod 166a extended in the first direction, and a first transporting portion 166b transporting the housing 165 along the first transporting rod 166a.

The first transporting rod 166a is secured with the base body 150, and the first transporting rod 166a may be screwed onto the housing 165. The first transporting portion 166b rotates the first transporting rod 166a in clockwise/counterclockwise direction so that the housing 165 may be transported along the first transporting rod 166a that is extended in the first direction.

Alternatively, the first transporting rod 166a may be secured with the base body 150, and the first transporting rod 166a may slide on the housing 165 so that the first transporting portion 166b transports the housing 165 in the first direction using a cylinder. Therefore, the housing 165 may be transported along the first transporting rod 166a that is extended in the first direction.

The chamber 170 includes a chamber body 172 and a vapor supplying unit 174.

The chamber body 172 includes a receiving space 170a that receives the base body 150 and the dropping unit 160.

The vapor supplying unit 174 supplies the receiving space 170a formed in the chamber body 172 with a volatile solvent vapor 174a. The volatile solvent vapor 174a is substantially identical to the volatile solvent in each of the droplets 160a. The vapor pressure of the volatile solvent vapor 174a is substantially identical to that of the volatile solvent in each of the droplets 160a that are dropped onto the substrate 10. Alternatively, the vapor pressure of the volatile solvent vapor may be less than the vapor pressure of the volatile solvent in each of the droplets 160a.

The vapor supplying unit 174 includes a storage container 174b, a vaporizer 174c and a nozzle part 174d.

A volatile solvent that is substantially identical to the volatile solvent in each of the droplets 160a is stored in the storage container 174b. The storage container 174b supplies the vaporizer 174c with the volatile solvent using a pump 174e. The vaporizer 174c evaporates the volatile solvent supplied from the storage container 174b using an ultrasonic wave or a heat. The nozzle part 174d supplies the receiving space 170a of the chamber body 172 with the volatile solvent vapor that is evaporated in the vaporizer 174c. The nozzle part 174d may spray the volatile solvent vapor to the receiving space 170a. The nozzle part 174d includes a space where the volatile solvent vapor is supplied and a nozzle hole (not shown) through which the volatile solvent vapor is supplied to the receiving space 170a. Alternatively, the nozzle part 174d may include a plurality of nozzle holes (not shown).

The storage container 174b may further include a pressure gauge 174f. The pressure gauge 174f senses the pressure of the volatile solvent vapor in the chamber body 172. Therefore, the pressure of the volatile solvent vapor in the chamber body 172 may be adjusted using the pressure gauge 174f.

Figure 5:
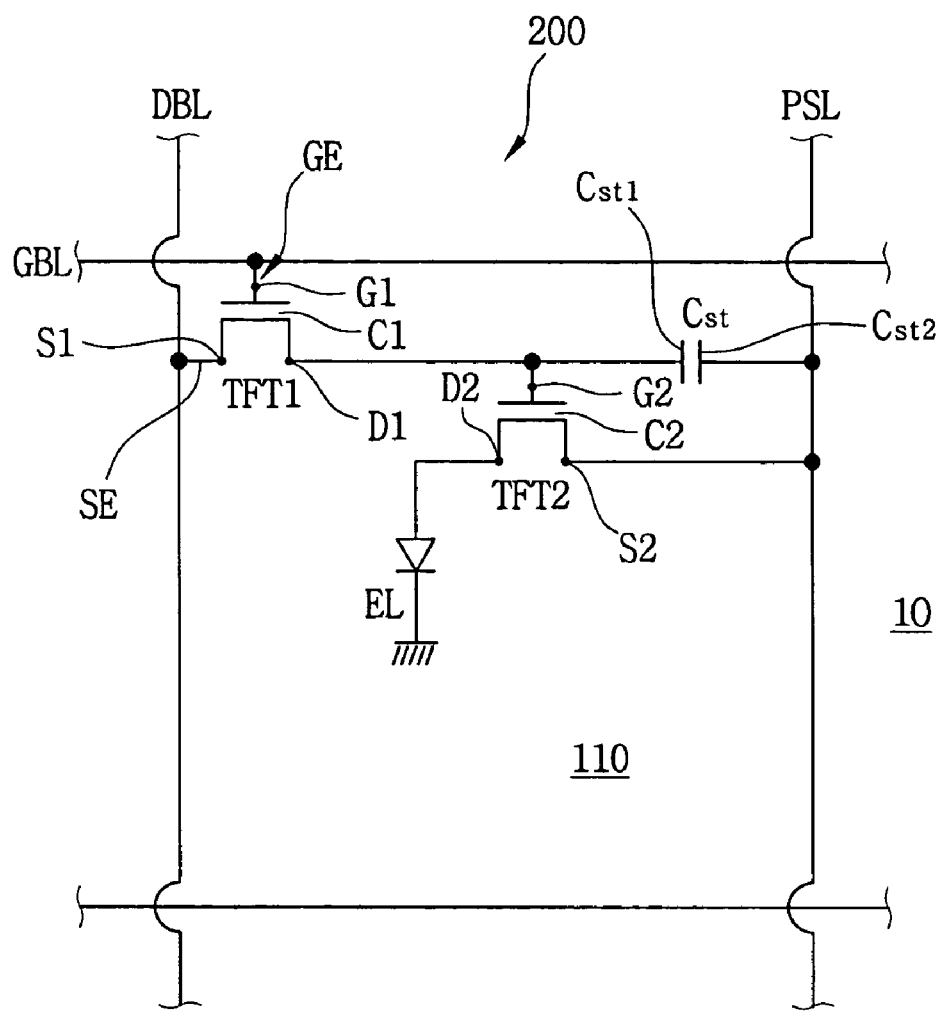
FIG. 5 is a circuit diagram showing a peripheral circuit region according to another exemplary embodiment of the present invention.
Figure 6A:
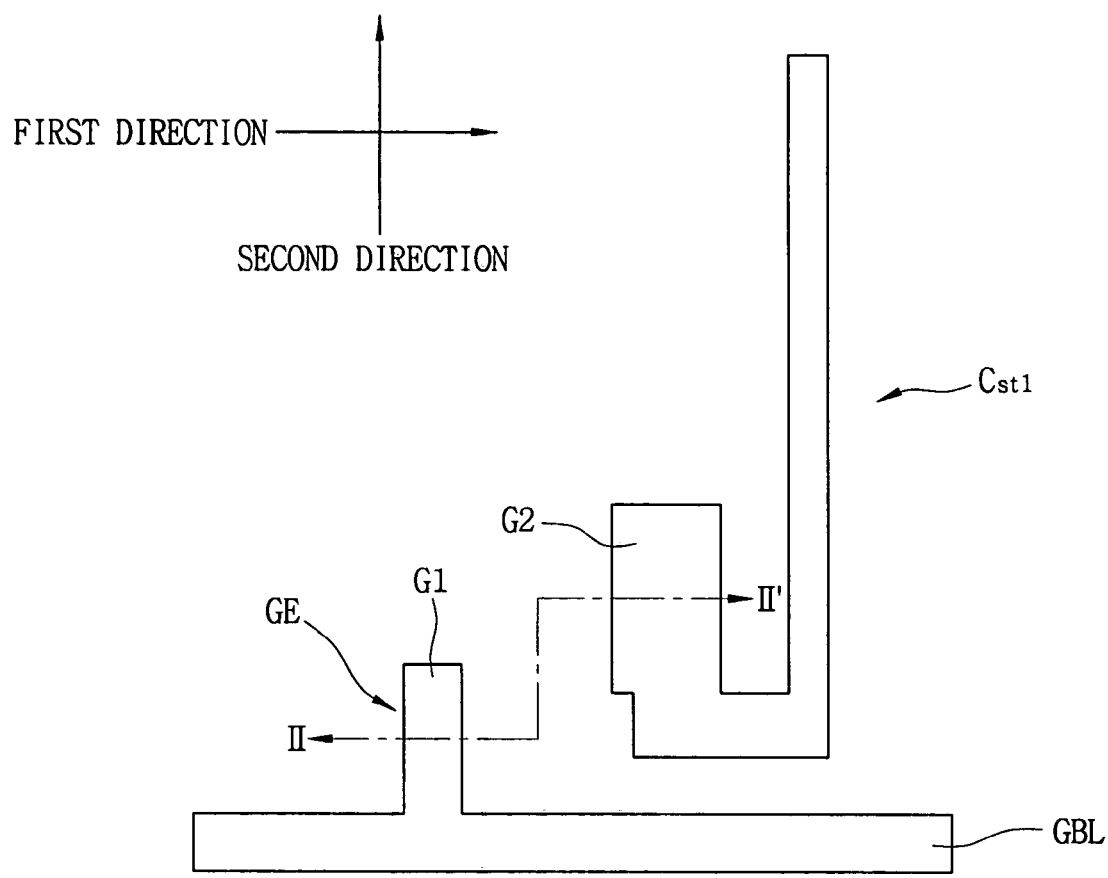
FIGS. 6A, 6C and 6E are plan views showing a method of manufacturing a peripheral circuit region according to another exemplary embodiment of the present invention.
Figure 6B:
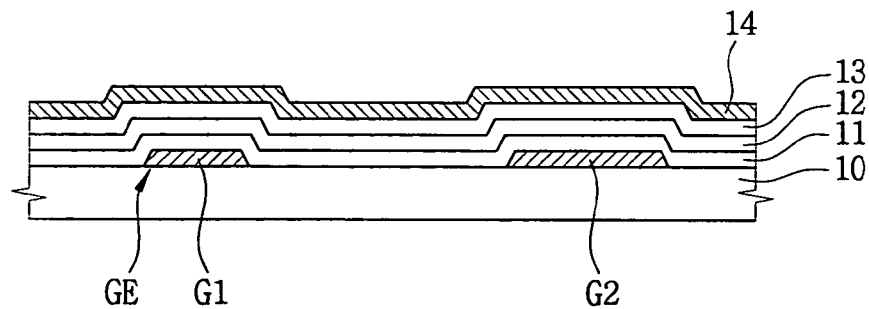
FIG. 6B is a cross-sectional view taken along the line II-II' in FIG. 6A.
Figure 6C:
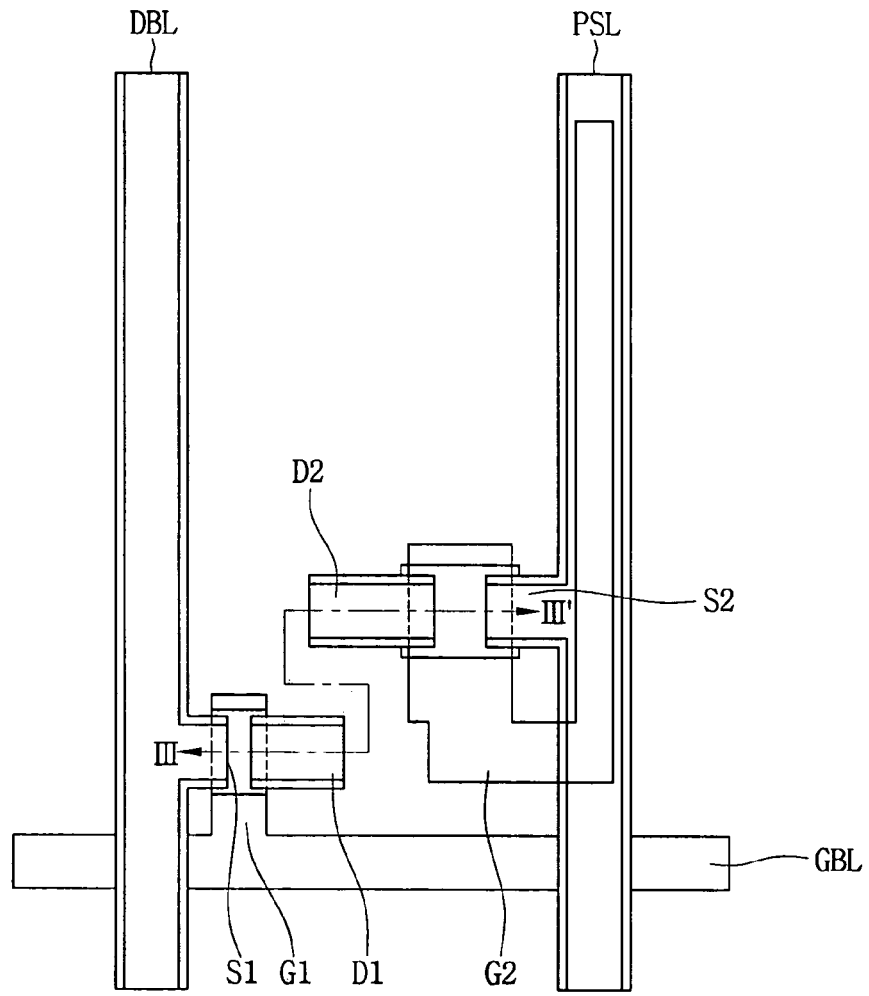
Figure 6D:
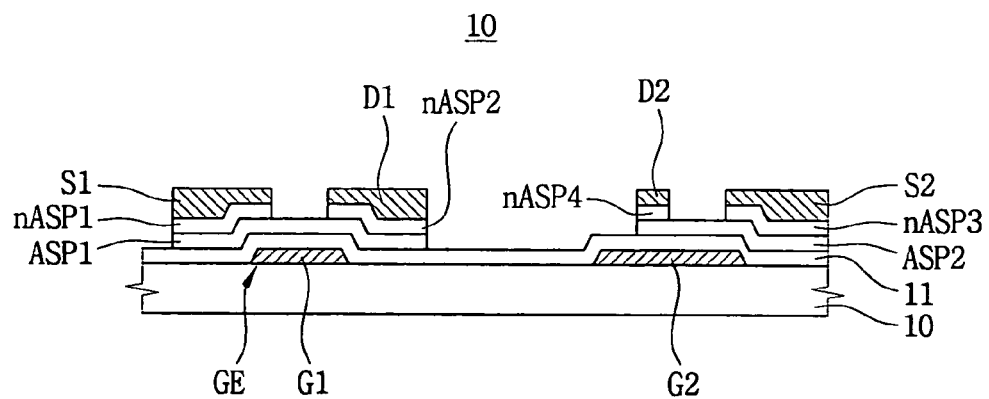
FIG. 6D is a cross-sectional view taken along the line III-III' in FIG. 6C.
Figure 6E:
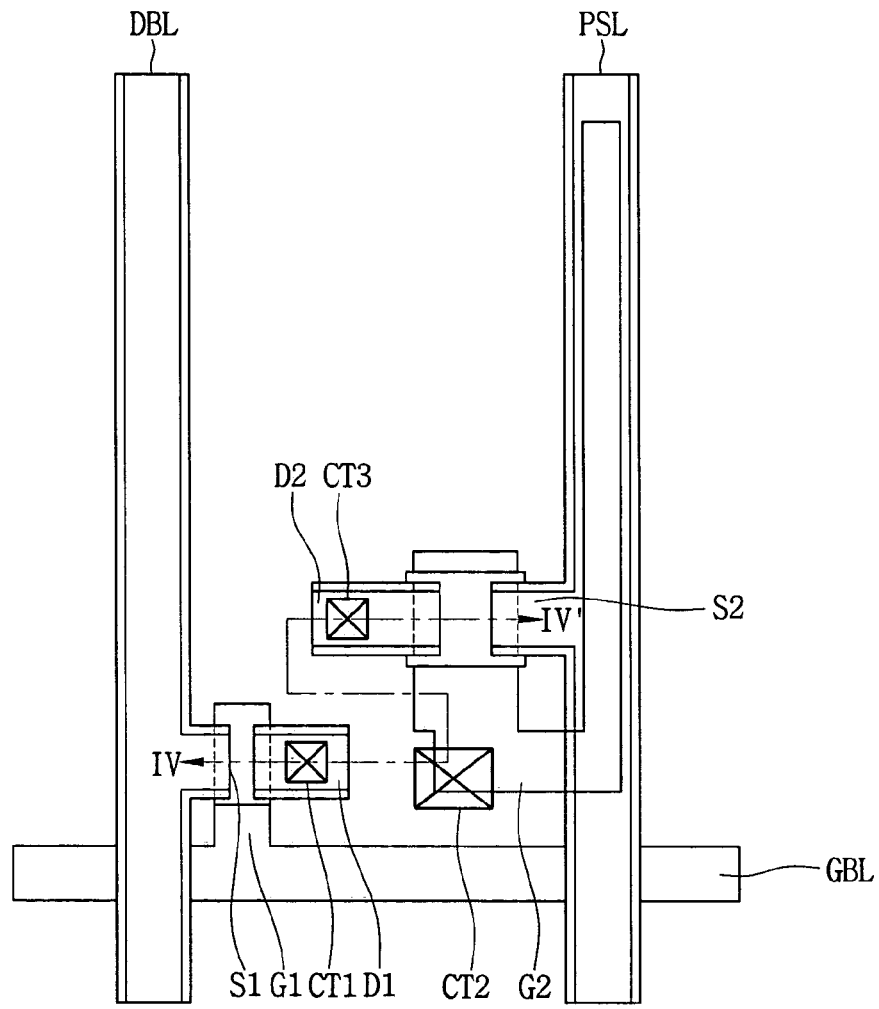
Figure 6F:
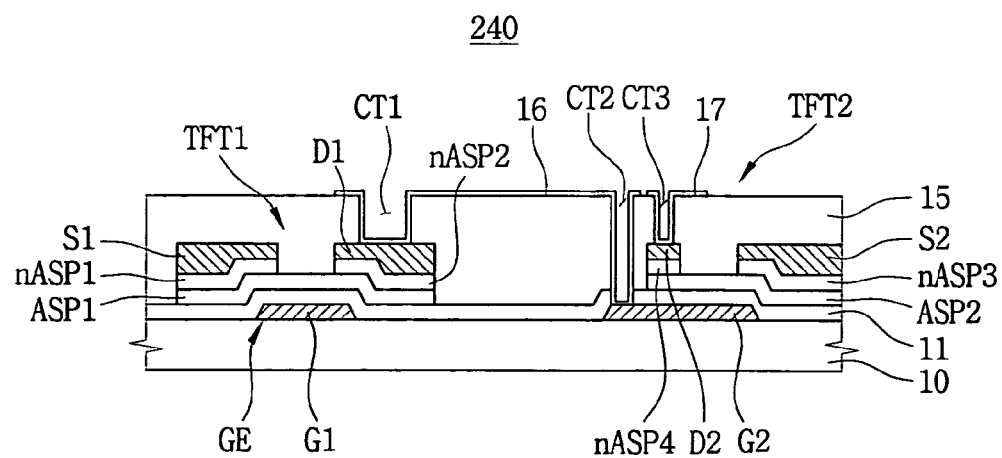
FIG. 6F is a cross-sectional view taken along the line IV-IV' in FIG. 6E.

FIG. 5 is a circuit diagram showing a peripheral circuit region according to another exemplary embodiment of the present invention, and FIGS. 6A, 6C and 6E are plan views showing a method of manufacturing a peripheral circuit region according to another exemplary embodiment of the present invention. FIGS. 6B, 6D and 6F are cross-sectional views taken along the line II-II', line III-III' and line IV-IV' in FIGS. 6A, 6C and 6E, respectively.

With reference to FIGS. 5 to 6F, the same reference numerals denote the same elements in FIGS. 1 to 3, and thus any further detailed descriptions concerning the same elements will be omitted.

Referring to FIGS. 5 to 6B, a gate metal thin film (not shown) is formed over a substrate 10. The gate metal thin film (not shown) may be formed through a chemical vapor deposition process or a sputtering deposition process. A photoresist material is coated over the gate metal thin film to form a photoresist thin film (not shown). The phosoresist thin film (not shown) is exposed through a first pattern mask and developed to form a photoresist pattern on the gate metal thin film.

The gate metal thin film (not shown) is patterned using the photoresist pattern as an etching mask, and the photoresist pattern is removed. Therefore, a gate electrode GE, a gate bus line GBL electrically connected to the gate electrode GE, a first capacitor electrode Cst1 of a storage capacitor Cst, and a second gate electrode G2 electrically connected to a first capacitor electrode Cst1 of a storage capacitor Cst are formed on the substrate 10.

An insulating layer 11 is then formed over the substrate 10 including the gate electrode GE, the gate bus line GBL, the first capacitor electrode Cst1 and the second gate electrode G2.

A first semiconductor layer 12 is formed over the insulating layer 11, and includes an amorphous silicon film. The first semiconductor layer 12 may be formed through the chemical vapor deposition process.

The second semiconductor layer 13 is formed over the first semiconductor layer 12. The second semiconductor layer 13 may be formed through the chemical vapor deposition process. A source/drain metal thin film 14 is formed over the second semiconductor layer 13. The source/drain metal thin film 14 may be formed through the chemical vapor deposition process or the sputtering deposition process.

Referring to FIGS. 6C and 6D, a photoresist material is coated over the source/drain metal thin film 14 to form a photoresist thin film (not shown). The photoresist material may be coated through a spin coating process or a slit coating process. The photoresist thin film (not shown) is then exposed through a second pattern mask, and developed to form a photoresist pattern (not shown) on the source/drain metal thin film 14.

The source/drain metal thin film 14 is patterned using the photoresist pattern (not shown) as an etching mask to form a first source electrode S1, a data bus line DBL electrically connected to the first source electrode S1, a first drain electrode D1, a second source electrode S2, a power supply line PSL electrically connected to the second source electrode S2 and a second drain electrode D2.

The first and second semiconductor layers 11 and 12 are then patterned using the first source electrode S1, the data bus line DBL, the first drain electrode D1, the second source electrode S2, the power supply line PSL and the second drain electrode D2 as an etching mask.

A shape of the patterned second semiconductor layer 12 is substantially identical to a shape of the first source electrode S1, the data bus line DBL, the first drain electrode D1, the second source electrode S2, the power supply line PSL and the second drain electrode D2.

Therefore, the second semiconductor layer 12 is patterned to form a first N+ amorphous silicon pattern nASP1, a second N+ amorphous silicon pattern nASP2, a third N+ amorphous silicon pattern nASP3 and a fourth N+ amorphous silicon pattern nASP4. The first N+ amorphous silicon pattern nASP1 is disposed under the first source electrode S1, and the second N+ amorphous silicon pattern nASP2 is disposed under the first drain electrode D1. The first N+ amorphous silicon pattern nASP1 is spaced apart from the second N+ amorphous silicon pattern nASP2, and the first N+ amorphous silicon pattern nASP1 is electrically insulated from the second N+ amorphous silicon pattern nASP2. The third N+ amorphous silicon pattern nASP3 is disposed under the second source electrode S2, and the fourth N+ amorphous silicon pattern nASP4 is disposed under the second drain electrode D2. The third N+ amorphous silicon pattern nASP3 is spaced apart from the fourth N+ amorphous silicon pattern nASP4, and the third N+ amorphous silicon pattern nASP3 is electrically insulated from the fourth N+ amorphous silicon pattern nASP4.

Therefore, the first semiconductor layer 11 is patterned to form a first amorphous silicon pattern ASP1 and a second amorphous silicon pattern ASP2 using the data bus line DBL, the first drain electrode D1, the power supply line PSL having the second source electrode S2 thereon and the second drain electrode D2 as an etching mask. The first amorphous silicon pattern ASP1 is disposed under the first and second N+ amorphous silicon patterns nASP1 and nASP2. The second amorphous silicon pattern ASP2 is disposed under the third and fourth N+ amorphous silicon patterns nASP3 and nASP4.

Therefore, a first thin film transistor TFT1, a second thin film transistor TFT2, the storage capacitor Cst, the gate bus line GBL, the data bus line DBL and the power supply line PSL are formed in the peripheral circuit region. The first thin film transistor TFT1 includes the first source electrode S1, the first gate electrode G1, the first drain electrode D1, the first amorphous silicon pattern ASP1, the first n+ amorphous silicon pattern nASP1 and the second amorphous silicon pattern nASP2. The second thin film transistor TFT2 includes the second source electrode S2, the second gate electrode G2, the second drain electrode D2, the second amorphous silicon pattern ASP2, the third n+amorphous silicon pattern nASP3 and the fourth amorphous silicon pattern nASP4.

Referring to FIGS. 6E and 6F, an insulating interlayer 15 is formed over the substrate 10. The insulating interlayer 15 may be formed through the chemical vapor deposition process. A photoresist thin film (not shown) is formed over the insulating interlayer 15. The photoresist thin film (not shown) may be formed through the spin coating process or the slit coating process. The photoresist thin film (not shown) is patterned using a fourth mask to form a photoresist pattern on the substrate 10.

The insulating interlayer 15 is etched using the photoresist pattern as an etching mask. The insulating interlayer 15 includes a first contact hole CT1, a second contact hole CT2 and a third contact hole CT3. The first drain electrode D1, the second gate electrode G2 and the second drain electrode D2 are partially exposed through the first to third contact holes CT1, CT2 and CT3, respectively.

A conductive transparent thin film (not shown) having low resistance is formed over the patterned insulating interlayer 15. A photoresist thin film (not shown) is coated over the conductive transparent thin film (not shown). The photoresist thin film (not shown) may be formed through the spin coating process or the slit coating process.

The photoresist thin film (not shown) is exposed using a fifth mask and developed to form a photoresist pattern on the transparent thin film (not shown). The conductive transparent thin film (not shown) is then partially etched using the photoresist pattern (not shown) so that a first electrode and a connecting electrode 16 are formed on the insulating interlayer 15. A plurality of first electrodes 17 may be formed on the insulating interlayer 15. The first electrodes 17 are electrically connected to the second drain electrode D2 through the third contact hole CT3. The connecting electrode 16 is electrically connected to the first drain electrode D1 and the second gate electrode G2 through the first and second contact holes CT1 and CT2, respectively.

Figure 7:
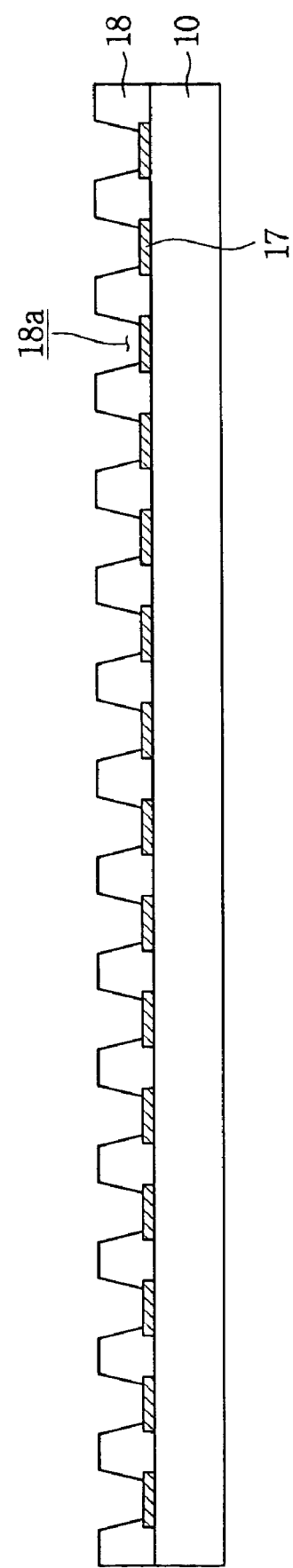
FIG. 7 is a cross-sectional view showing partition walls according to another exemplary embodiment of the present invention.

FIG. 7 is a cross-sectional view showing partition walls according to another exemplary embodiment of the present invention. FIG. 8 is a plan view showing partition walls according to another exemplary embodiment of the present invention.

Referring to FIGS. 7 and 8, the partition walls 18 surrounds each of the first electrodes 17 disposed on the substrate 10. The partition walls 18 form a cavity. The partition walls 18 may form a plurality of cavities 18a. Preferably, the cross-sectional view of each of the partition walls 18 is a trapezoidal shape.

The cavities 18a are arranged in a matrix shape that is substantially identical to an arrangement of the first electrodes 17. The cavities 18a are divided into a plurality of groups. The number of the cavities 18a in each of the groups may be determined in response to the number of the nozzles 132 of the apparatus 100 for supplying the droplet on the substrate 10. A dummy area DA surrounds the groups having the cavities 18a. The cavities 18a may be divided into a first group, a second group and a third group, and the dummy area DA surrounds the first to third groups.

Figure 9B:
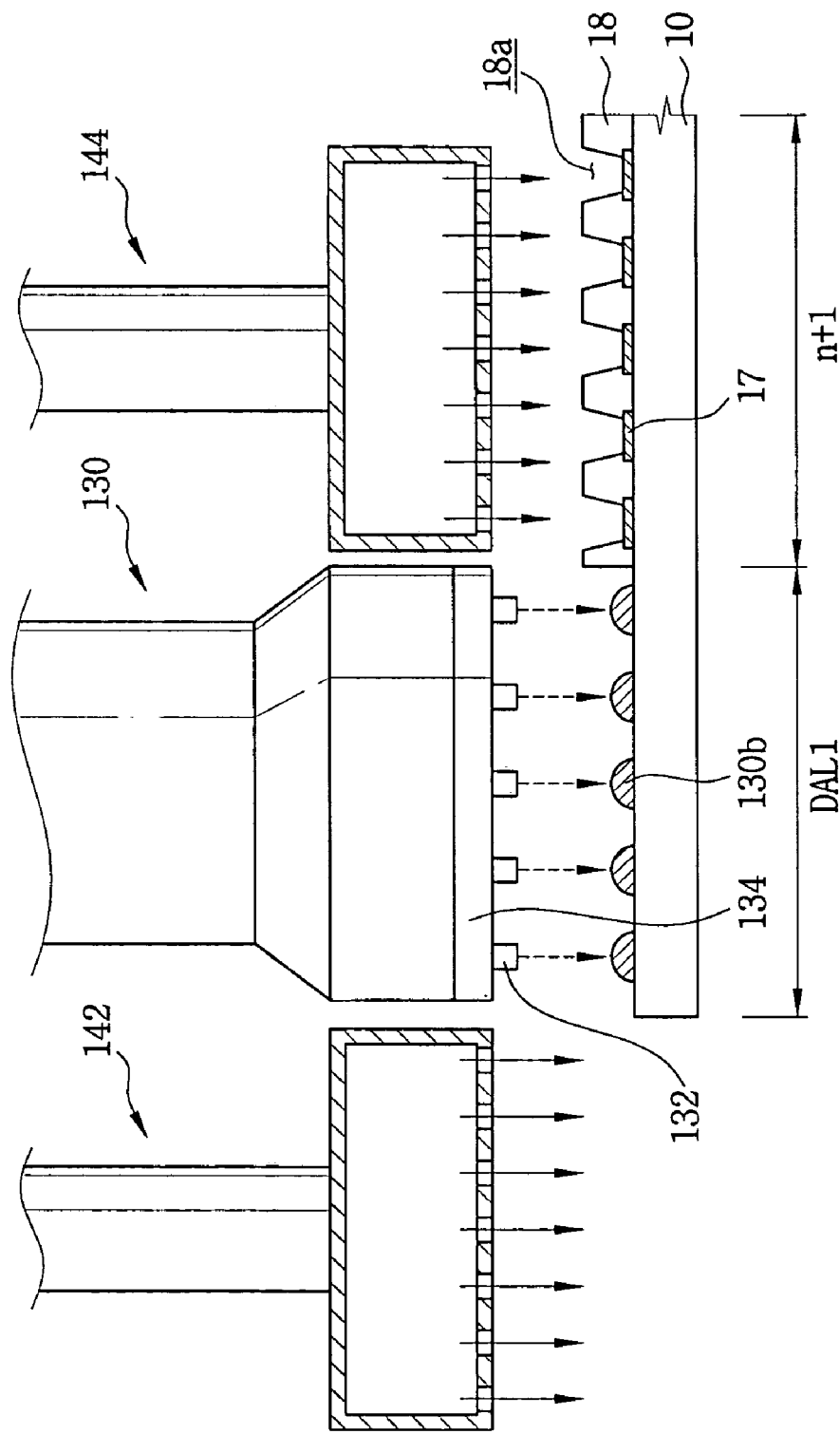
FIG. 9B is a cross-sectional view taken along the line V-V' in FIG. 9A.
Figure 9G:
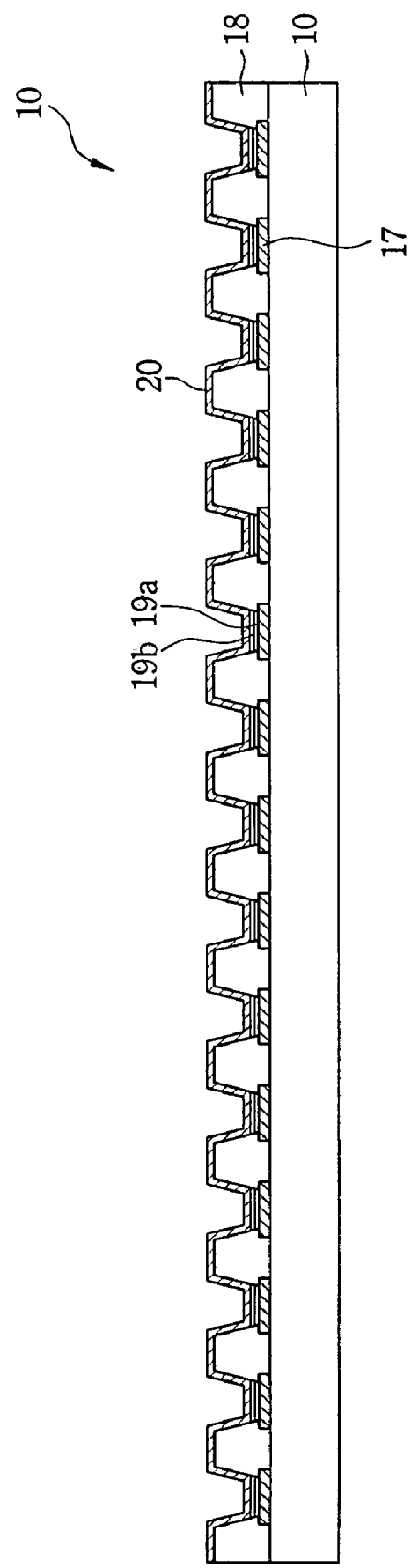
FIG. 9G is a cross-sectional view showing a display apparatus according to an exemplary embodiment.

FIGS. 9A, 9C and 9E are plan views showing a method of manufacturing a display apparatus using an apparatus for supplying a droplet on a substrate according to an exemplary embodiment of the present invention. FIG. 9B is a cross-sectional view taken along the line V-V' in FIG. 9A. FIG. 9D is a cross-sectional view taken along the line VI-VI' in FIG. 9C. FIG. 9F is a cross-sectional view taken along the line VII-VII' in FIG. 9E. FIG. 9G is a cross-sectional view showing a display apparatus according to an exemplary embodiment.

With reference to FIGS. 9A to 9G, the same reference numerals denote the same elements in FIGS. 1 to 3, and thus any further detailed descriptions concerning the same elements will be omitted.

Referring to FIGS. 9A and 9B, a nozzle of an apparatus 100 for supplying a droplet on a substrate 10 supplies a first dummy region DAL1 with a material that forms an organic light emitting layer. The material includes a volatile solvent so that a dummy droplet is formed in the first dummy region DAL1. The apparatus 100 for supplying the droplet on the substrate 10 may include a plurality of nozzles 132, and the apparatus 100 for supplying the droplet on the substrate 10 may form a plurality of dummy droplets 130b. The dummy droplets 130b uniformize a vapor pressure of droplets 130a of a first group.

A dummy area DA surrounds the first to third groups. The dummy area DA includes a first dummy region DAL1 disposed on a left portion of the substrate 10, a second dummy region DAL2 disposed on a right portion of the substrate 10 and a third dummy region DAU disposed on an upper portion of the substrate 10.

A second supplying module 144 of a vapor supplying unit 140 supplies the first group with a volatile solvent vapor while a dropping unit 130 forms the dummy droplets 130b in the first dummy region DAL1.

After the dummy droplets 130b are disposed in the first dummy region DAL1 by the apparatus 100 for supplying the droplet on the substrate 10, the base body 120 of the apparatus 100 for supplying the droplet on the substrate 10 is transported to the first group in a second direction. Therefore, a first supplying module 142 of the vapor supplying unit 140, the second supplying module 144 and the dropping unit 130 are disposed in the first dummy region DAL1, the first group and the second group, respectively. The dropping unit 130 is transported to the first group while the dropping unit 130 forms the dummy droplets 130b in the third dummy region DAU disposed adjacent to the first dummy region DAL1.

Referring to FIGS. 9C and 9D, each of the nozzles 132 of the dropping unit 130 is transported to the first group, and drops the droplet 130a including the material that forms the organic light emitting layer into the cavity 18a of the first group. The first supplying module 142 of the vapor supplying unit 140 is disposed in the first dummy region DAL1. The first supplying module 142 supplies the first dummy region DAL1 with the volatile solvent vapor. The second supplying module 144 of the vapor supplying unit 140 is disposed in the second group. The second supplying module 144 supplies the second group with the volatile solvent vapor.

The vapor supplying unit 140 supplies the first dummy region DAL1 and the second group with the volatile solvent vapor so as to uniformize a thickness of thin films formed on the first electrodes 17. Each of the droplets 130a dropped into the first group includes a material that forms a hole injection layer.

Referring to FIGS. 9E and 9F, after the droplets 130a are formed in the first group using the nozzles 132 of the dropping unit 130, the dropping unit 130, the first supplying module 142 of the vapor supplying unit 140 and the second supplying module 144 of the vapor supplying unit 140 are transported to the second, first and third groups, respectively. The dropping unit 130 drops the dummy droplets 130b into the second dummy region DAL2, and then the dropping unit 130 drops the droplets 130a into the cavities 18a of the second group. The first supplying module 144 of the vapor supplying unit 140 is disposed in the first group so as to supply the droplets 130a dropped in the first group with the volatile solvent vapor. The second supplying module 144 of the vapor supplying unit 140 is disposed in the third group so as to supply the third group with the volatile solvent vapor.

The vapor supplying unit 140 supplies the first group and the third group with the volatile solvent vapor so that an evaporation rate of the droplets 130a in the second group is uniformized, thereby uniformizing the thickness of thin films formed on the first electrodes 17 that are disposed in the cavities 18a of the second group. The droplets 130a dropped into the second group includes the material that forms the hole injection layer.

Therefore, the apparatus 100 for supplying the droplet on the substrate 10 supplies the cavities 18a on the substrate 10 with the droplets 130a including the material that forms the organic light emitting layer.

Referring to FIG. 9G, the droplets 130a are dried to form a hole injection layer 19a on the first electrodes 17.

After the hole injection layer is formed on each of the first electrodes 17, the apparatus 100 for supplying the droplet on the substrate 10 supplies the hole injection layer with droplets including a light emitting material to form an organic light emitting layer 19b on each of the first electrodes 17.

The second electrode 20 is formed over the substrate 10. The second electrode 20 includes aluminum (Al), aluminum alloy, etc.

Alternatively, the processes of FIGS. 9A to 9G may be performed in-situ.

Figure 10:
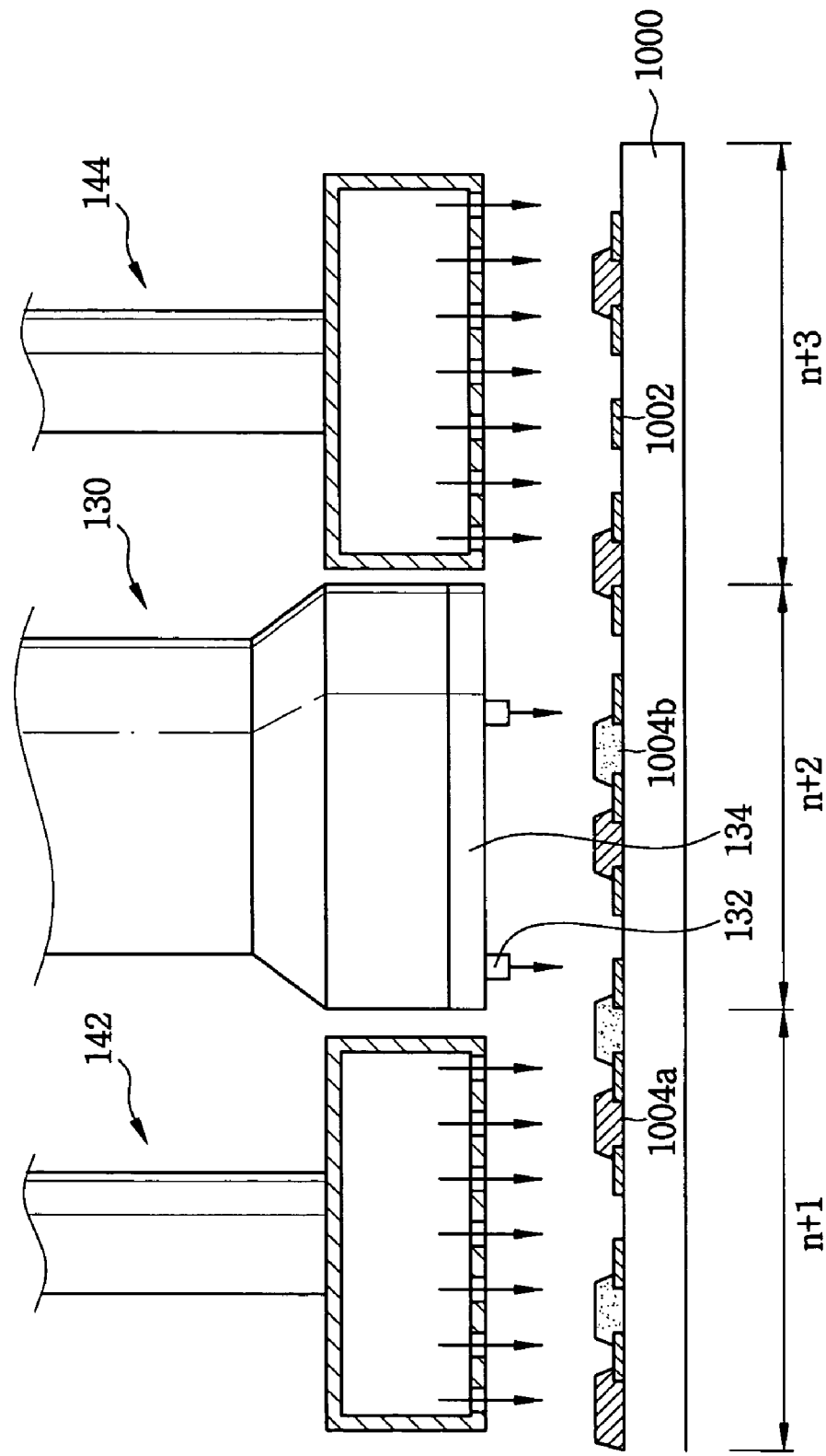
FIG. 10 is a cross-sectional view showing a method of manufacturing a color filter substrate using an apparatus for supplying a droplet on a substrate according to another exemplary embodiment of the present invention.
Figure 11:
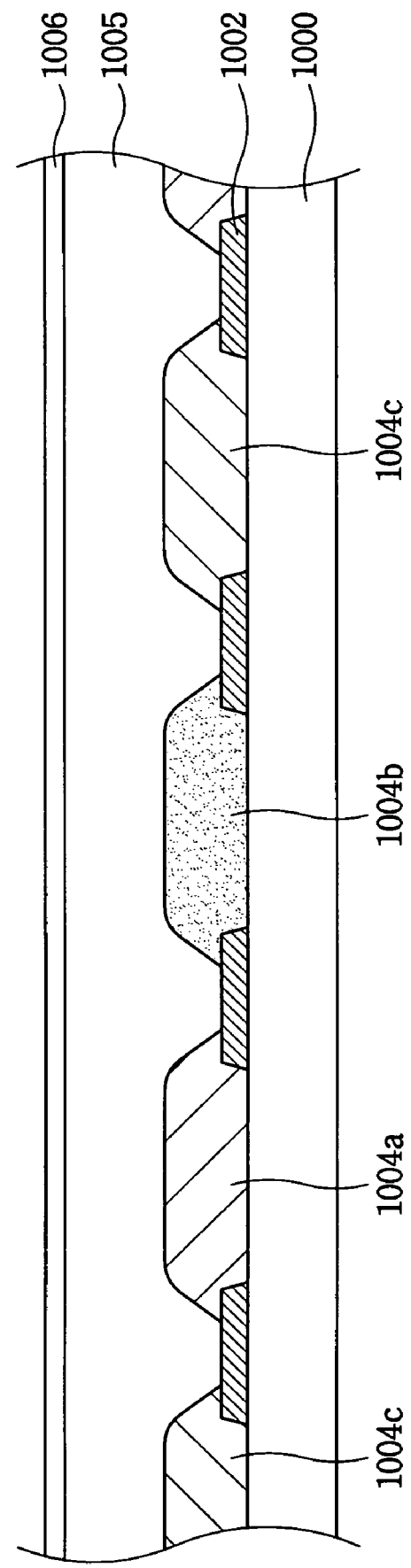
FIG. 11 is a cross-sectional view showing a color filter substrate manufactured using the apparatus shown in FIG. 10.

FIG. 10 is a cross-sectional view showing a method of manufacturing a color filter substrate using an apparatus for supplying a droplet on a substrate according to another exemplary embodiment of the present invention. FIG. 11 is a cross-sectional view showing a color filter substrate manufactured using the apparatus shown in FIG. 10. With reference to FIGS. 10 to 11, the same reference numerals denote the same elements in FIGS. 1 to 3, and thus any further detailed descriptions concerning the same elements will be omitted.

Referring to FIGS. 10 and 11, the apparatus 100 for supplying the droplet on the substrate 1000 supplies the droplet including a red colorant and a volatile solvent on the substrate 1000 to form a red color filter 1004a, while supplying a volatile solvent vapor onto the substrate 1000. The apparatus 100 for supplying the droplet on the substrate 1000 supplies the droplet including a green colorant and the volatile solvent on the substrate 1000 to form a green color filter 1004b, while supplying the volatile solvent vapor onto the substrate 1000. The apparatus 100 for supplying the droplet on the substrate 1000 supplies the droplet including a blue colorant and the volatile solvent on the substrate 1000 to form a blue color filter 1004c, while supplying the volatile solvent vapor onto the substrate 1000. Alternatively, the apparatus 100 for supplying the droplet on the substrate 1000 may supply the droplet including a red pigment, a green pigment or a blue pigment. An overcoating layer 1005 is formed on the substrate 1000 having the red, green and blue color filters 1004a, 1004b and 1004c. A common electrode 1006 is formed on the overcoating layer 1005 to form the color filter substrate.

In these exemplary embodiments, the apparatus for supplying the droplet on the substrate forms the organic light emitting layer of the OLED apparatus, a hole injection layer of the OLED apparatus and the color filter of the color filter substrate. Alternatively, the apparatus for supplying the droplet on the substrate may form a bank of the OLED apparatus, a fluorescent layer of a plasma display panel (PDP) apparatus, etc.

According to the present invention, the evaporation rate of the droplets dropped onto pixels is adjusted to control the thickness of the layer, thereby improving the image display quality.

This invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. An apparatus for supplying a droplet on a substrate including a first region that extends along a first direction and a second region that is adjacent to the first region, the apparatus comprising:
   a base body;
   a dropping unit coupled to the base body and disposed between the base body and the substrate, the dropping unit including a nozzle plate having a plurality of nozzles to drop the droplet on the first region of the substrate and moving on the first region of the substrate along the first direction; and
   a vapor supplying unit disposed adjacent to the dropping unit in a second direction perpendicular with respect to the first direction to spray a volatile solvent vapor on the second region of the substrate,
   wherein the vapor supplying unit remains at a predetermined position while the dropping unit moves from a first end of the first region with respect to the first direction to a second end of the first region which is opposite to the first end of the first region.

2. The apparatus of claim 1, wherein the droplet comprises a solute and a volatile solvent.

3. The apparatus of claim 2, wherein the solute comprises a material that forms a hole injection layer, a material that that forms an electron injection layer, a material that forms an organic light emitting layer, a material that forms a color filter or an organic material having photoresist.

4. The apparatus of claim 1, wherein the dropping unit is transported in the first direction and shifted in the second direction, and the vapor supplying unit is shifted in the second direction together with the dropping unit.

5. The apparatus of claim 4, further comprising a base transporting unit to transport the base body in the second direction.

\* \* \* \* \*